US011619882B2

(12) United States Patent
Matejka et al.

(10) Patent No.: US 11,619,882 B2
(45) Date of Patent: Apr. 4, 2023

(54) METHOD AND APPARATUS FOR CHARACTERIZING A MICROLITHOGRAPHIC MASK

(71) Applicant: Carl Zeiss SMT GmbH, Oberkochen (DE)

(72) Inventors: Ulrich Matejka, Jena (DE); Holger Seitz, Jena (DE); Thomas Frank, Jena (DE); Asad Rasool, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/470,340

(22) Filed: Sep. 9, 2021

(65) Prior Publication Data
US 2022/0075272 A1 Mar. 10, 2022

(30) Foreign Application Priority Data

Sep. 10, 2020 (DE) .......................... 102020123615.8

(51) Int. Cl.
*G03F 7/20* (2006.01)
*G03F 1/84* (2012.01)
(52) U.S. Cl.
CPC ............ *G03F 7/70133* (2013.01); *G03F 1/84* (2013.01); *G03F 7/7085* (2013.01); *G03F 7/70516* (2013.01); *G03F 7/70566* (2013.01)
(58) Field of Classification Search
CPC ............ G03F 7/70133; G03F 7/70516; G03F 7/70566; G03F 7/7085; G03F 7/70091;
(Continued)

(56) References Cited

U.S. PATENT DOCUMENTS 7,286,284 B2   10/2007   Totzeck et al.
8,913,120 B2   12/2014   Poortinga et al.
(Continued)

FOREIGN PATENT DOCUMENTS

DE   102004033602   2/2006   ............ G01M 11/00
DE   102004033603   2/2006   ............ G01M 11/00
(Continued)

OTHER PUBLICATIONS

German Office Action for German Application No. DE 10 2020 123 615.8, dated Apr. 19, 2021 (with English Translation).
(Continued)

*Primary Examiner* — Christina A Riddle
(74) *Attorney, Agent, or Firm* — Fish & Richardson P.C.

(57) ABSTRACT

The invention relates to a method and an apparatus for characterizing a microlithographic mask. In a method according to the invention, structures of a mask intended for use in a lithography process in a microlithographic projection exposure apparatus are illuminated by an illumination optical unit, wherein the mask is imaged onto a detector unit which has a plurality of pixels by an imaging optical unit. Here, a plurality of individual imaging processes are carried out with a pixel resolution specified by the detector unit, wherein these individual imaging processes differ from one another in respect of the position of at least one polarization-optical element situated in the imaging optical unit, wherein image data recorded by the detector unit are evaluated in an evaluation unit, wherein polarization-dependent effects on account of a polarization dependence of the interference of electromagnetic radiation that takes place in the wafer plane during the operation of the microlithographic projection exposure apparatus are emulated, wherein a conversion of the image data obtained in the individual imaging processes is implemented, in each case on the basis of at least one (Continued)

calibration image obtained by imaging a structure-free region of the mask onto the detector unit, wherein the calibration image respectively used is chosen differently depending on the position of the at least one polarization-optical element.

20 Claims, 5 Drawing Sheets

(58) Field of Classification Search
CPC .... G03F 7/70; G03F 7/70216; G03F 7/70283; G03F 7/70425; G03F 7/70483–70541; G03F 7/70591; G03F 7/706; G03F 7/70616; G03F 7/70666; G03F 7/70908–70941; G03F 7/70958; G03F 7/70966; G03F 7/70975; G03F 7/70983; G03F 1/84; G03F 1/20; G03F 1/22; G03F 1/36; G03F 1/68; G03F 1/82; G01N 2021/8843; G01N 2021/8884; G01N 2021/95676; G02B 7/38; G02B 21/0092; G02B 21/244; G02B 21/367; G02B 21/0016
USPC ..... 355/30, 52–55, 67–77; 430/5, 20, 22, 30
See application file for complete search history.

(56) References Cited

U.S. PATENT DOCUMENTS

| | | | |
|---|---|---|---|
| 9,222,897 B2* | 12/2015 | Seitz | ................ G01N 21/95607 |
| 10,168,273 B1 | 1/2019 | Huang et al. | |
| 10,698,318 B2 | 6/2020 | Seitz et al. | |
| 2006/0007541 A1 | 1/2006 | Totzeck et al. | |
| 2006/0012873 A1 | 1/2006 | Totzeck et al. | |
| 2008/0297775 A1 | 12/2008 | Greif-Wustenbecker et al. | |
| 2011/0090329 A1* | 4/2011 | Poortinga | ............... G03F 7/705 348/79 |
| 2012/0162755 A1 | 6/2012 | Stroessner et al. | |
| 2013/0156939 A1* | 6/2013 | Budach | .................. B82Y 40/00 427/523 |
| 2014/0086475 A1* | 3/2014 | Daneshpanah | ......... G06T 7/001 382/144 |
| 2019/0011839 A1* | 1/2019 | Seitz | ................... G03F 7/70091 |
| 2020/0363737 A1* | 11/2020 | Kamp-Froese | ..... G03F 7/70516 |
| 2021/0063892 A1 | 3/2021 | Martin et al. | |

FOREIGN PATENT DOCUMENTS

| | | | | |
|---|---|---|---|---|
| DE | 102005062237 | | 7/2007 | ............... G03F 7/20 |
| DE | 102007009661 | | 3/2008 | ............ G02B 27/50 |
| DE | 102007045891 | | 4/2008 | ................ G01J 4/00 |
| DE | 102009038558 | | 3/2011 | ............... G03F 7/20 |
| DE | 102009041405 | | 3/2011 | ............. G02B 21/06 |
| DE | 102013107976 | | 1/2015 | ............. G01B 11/03 |
| DE | 102015213163 | | 1/2017 | ............... G06T 5/00 |
| DE | 102017115262 | | 1/2019 | ............... G03F 1/84 |
| DE | 102019123741 | | 3/2021 | ............... G03F 1/84 |
| EP | 1 615 062 | | 4/2008 | ............. G02B 21/00 |
| JP | 2006-23307 | | 1/2006 | ........... G01N 21/956 |
| TW | 201907227 | A | 2/2019 | ............... G03F 1/82 |

OTHER PUBLICATIONS

Office Action and Search Report issued by the Taiwan Patent Office for Application No. TW 110133515 dated Jul. 5, 2022 (with English Translation).

Office Action issued by the Taiwan Patent Office for Application No. TW 110133515 dated Jan. 9, 2023 (with English Translation).

* cited by examiner

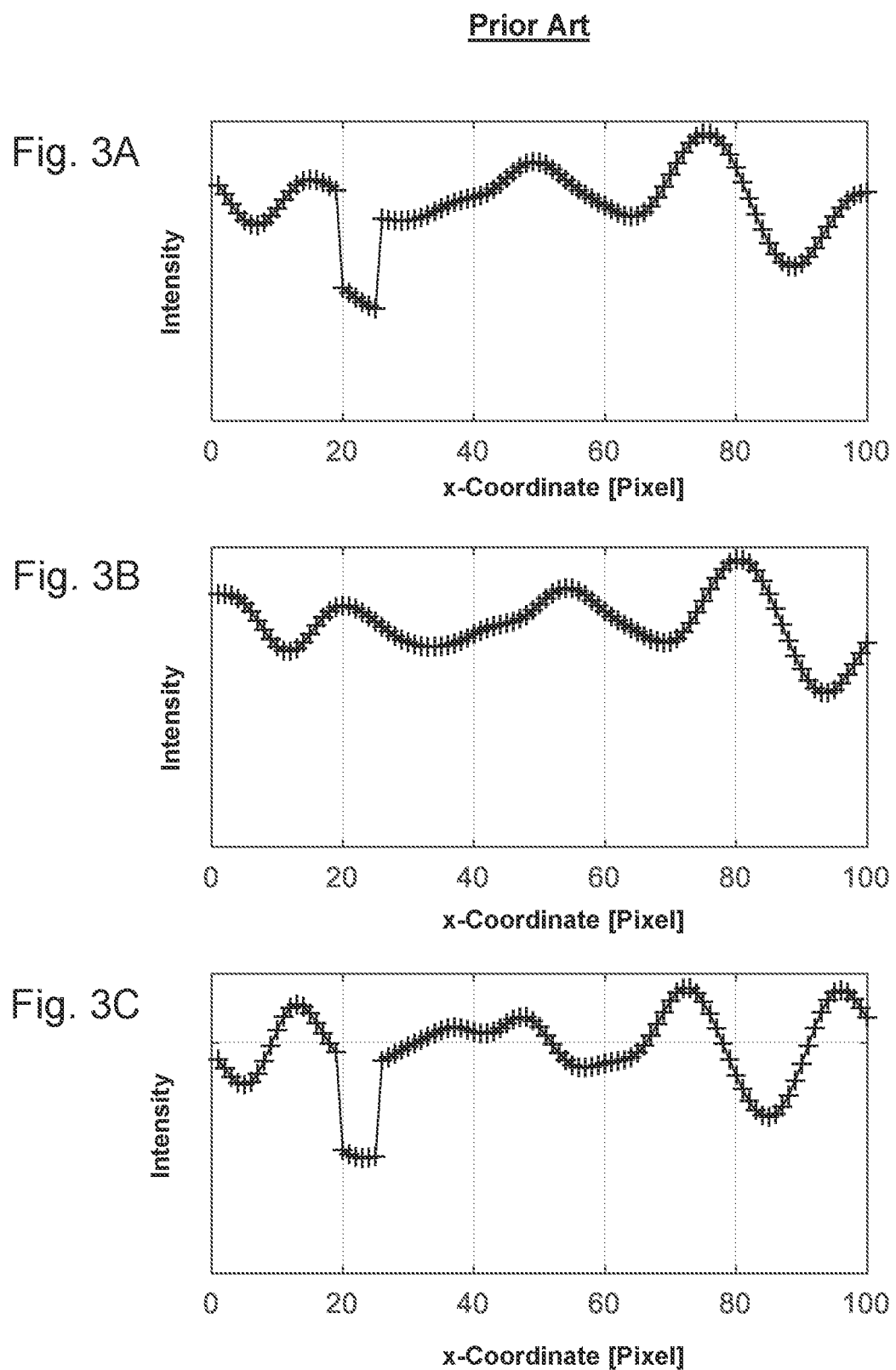

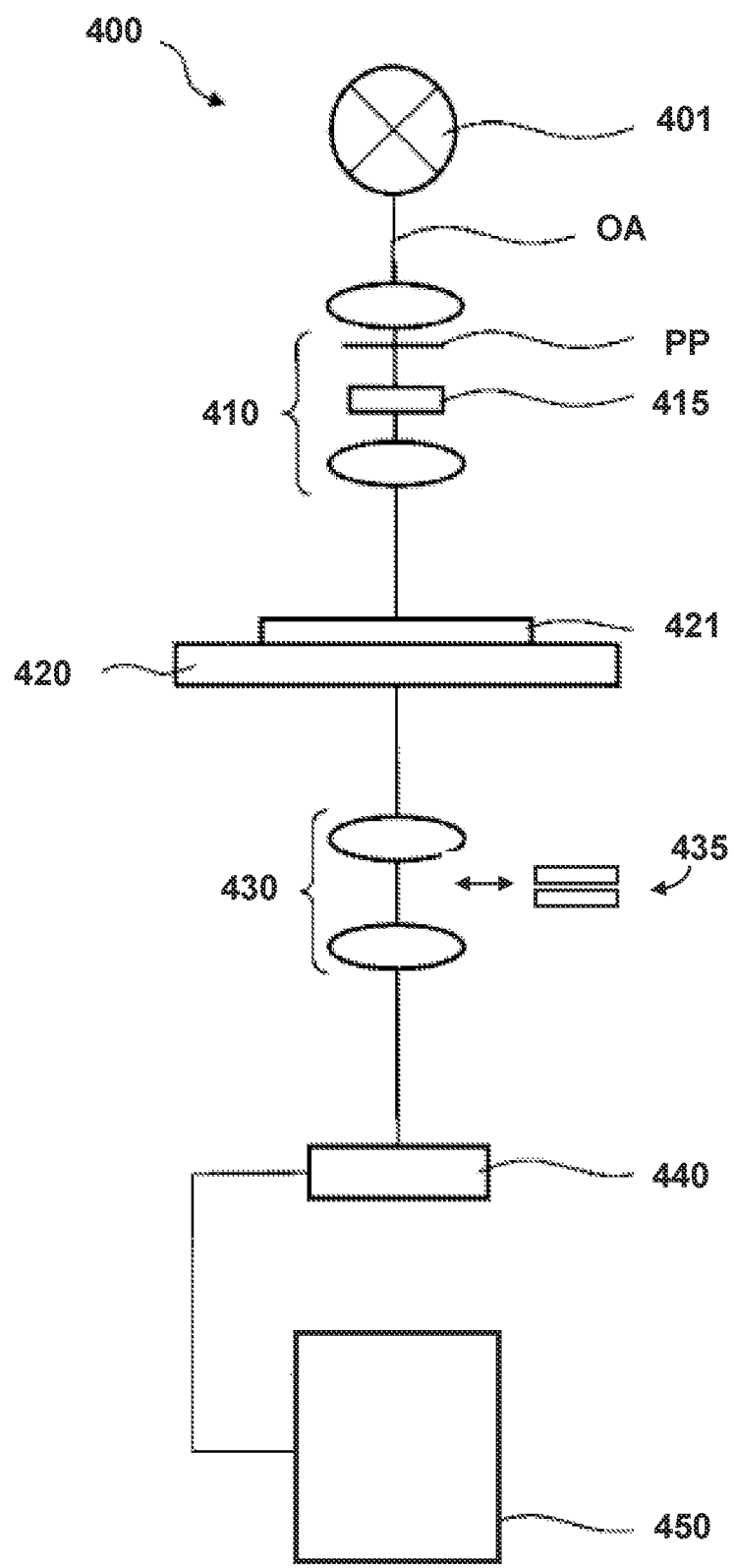

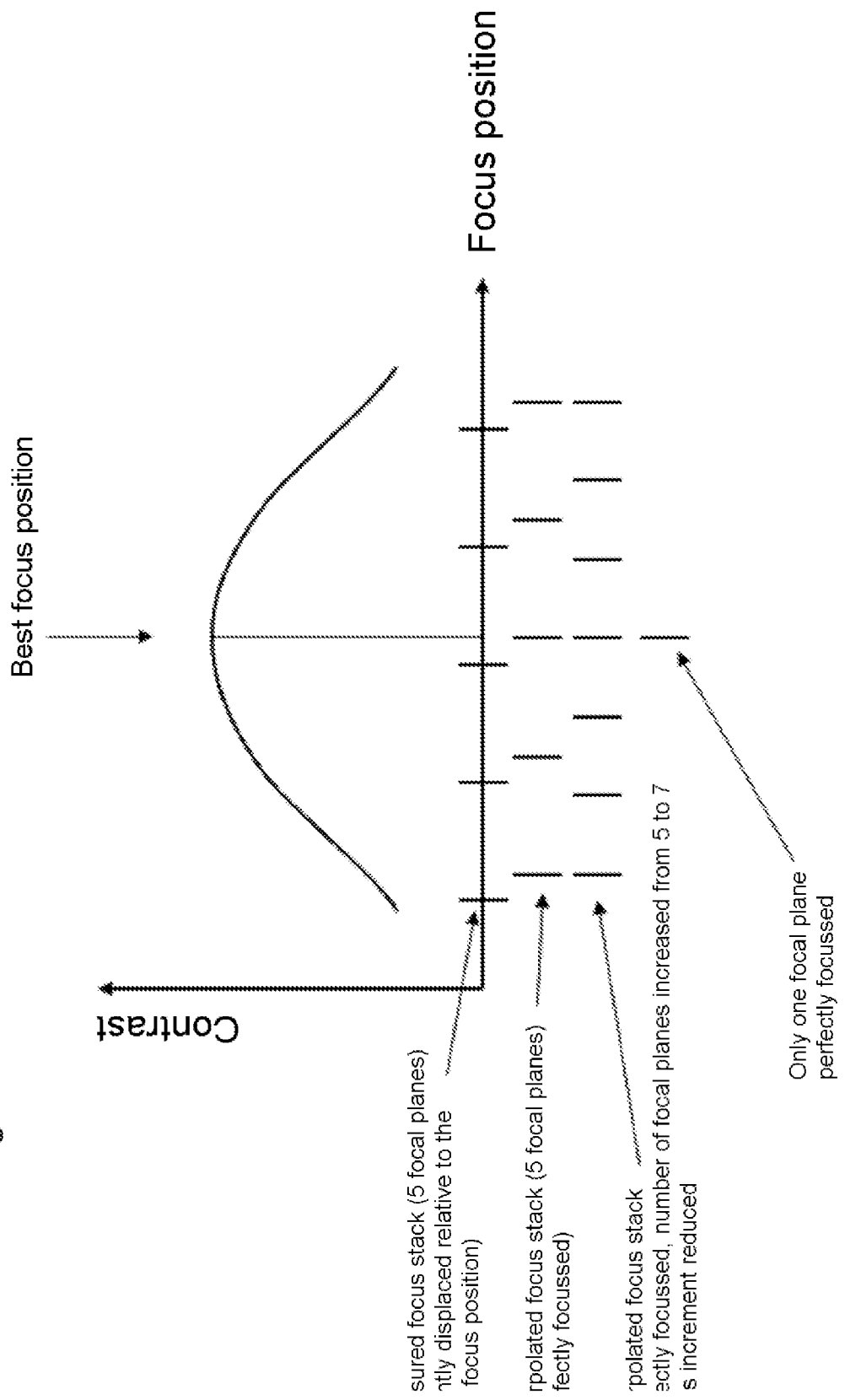

METHOD AND APPARATUS FOR CHARACTERIZING A MICROLITHOGRAPHIC MASK

CROSS-REFERENCE TO RELATED APPLICATIONS

This application claims priority of German Patent Application DE 10 2020 123 615.8, filed on Sep. 10, 2020, the entire contents of which are hereby incorporated by reference.

TECHNICAL FIELD

The invention relates to a method and an apparatus for characterizing a microlithographic mask. The invention is applicable both to finding defects and characterizing defects and in further applications for characterizing the structures on a mask, for instance in position determination or for determining the line width of the structures (CD="critical dimension") and for ascertaining process windows (e.g., by determining the line width depending on dose and defocus).

BACKGROUND

Microlithography is used for production of microstructured components, such as integrated circuits or LCDs, for example. The microlithography process is carried out in what is known as a projection exposure apparatus, which includes an illumination device and a projection lens. The image of a mask (=reticle) illuminated by use of the illumination device is in this case projected by use of the projection lens onto a substrate (e.g., a silicon wafer) coated with a light-sensitive layer (photoresist) and arranged in the image plane of the projection lens, in order to transfer the mask structure onto the light-sensitive coating of the substrate.

In the microlithography process, undesired defects on the mask have a particularly disadvantageous effect since they can be reproduced with every exposure step. A direct analysis of the imaging effect of possible defect positions is thus desirable in order to minimize the mask defects and in order to realize a successful mask repair. Therefore, there is a need to measure or to qualify the mask rapidly and simply, to be precise as far as possible under the same conditions such as are really present in the projection exposure apparatus.

For this purpose, it is known, in a mask inspection apparatus, to record and evaluate an aerial image of a segment of the mask. To record the aerial image, the structures to be measured on the mask are illuminated by an illumination optical unit in this case, wherein the light coming from the mask is projected via an imaging optical unit onto a detector unit and detected. In order to carry out the measurement of the mask if possible under conditions analogous to those in the projection exposure apparatus, in the mask inspection apparatus the mask is typically illuminated in a manner identical to that in the projection exposure apparatus in this case, wherein in particular the same wavelength (e.g., approximately 248 nm, approximately 193 nm or approximately 13.5 mm), the same numerical aperture and also the identical (if appropriate polarized) illumination setting are set in the mask inspection apparatus.

However, in practice a problem results from the fact that in the imaging optical unit of the mask inspection apparatus, the imaging of the mask onto the detector unit—unlike the imaging on the wafer that is carried out in the projection exposure apparatus—does not take place in reduced fashion, but rather in greatly magnified fashion. The thus greatly different numerical aperture present in the respective projection or imaging optical unit (said numerical aperture being almost zero in the imaging optical unit of the mask inspection apparatus) has the consequence that the imaging on the wafer that takes place in the lithography process differs significantly from the imaging on the detector unit that takes place in the mask inspection apparatus with regard to polarization-dependent vector effects that occur. In this case, "vector effect" should be understood to mean the polarization dependence of the interference of the electromagnetic radiation that occurs in the respective image plane.

In order to take account of the above problem and to determine the vector effects that occur in the microlithographic projection exposure apparatus and to take them into account in the aerial image generation, it is known, in particular, to carry out a plurality of individual imaging processes with the mask inspection apparatus, during which individual imaging processes different polarization-optical components are placed in the illumination and/or imaging optical unit in different positions and the correspondingly generated images are combined with one another and subjected to computation.

However, in practice, the introduction of one or more polarization-optical elements into the beam path results in further problems which, as a result, make a correct combination by calculation of the individual images with one another and hence a reliable emulation of the conditions present in the projection exposure apparatus during the mask characterization more difficult: Firstly, generally unavoidable contaminations and/or inhomogeneities present on the polarization-optical elements lead to artefacts in the obtained measurement images, matters being complicated further by the fact that the effect of said contaminations or inhomogeneities is differently pronounced depending on the position of the polarization-optical element or the polarization-optical elements.

Moreover, the introduction of polarization-optical elements into the imaging beam path of the mask inspection apparatus has as a consequence an image shift and furthermore also a change in the imaging scale on account of unavoidable manufacturing errors.

Within the scope of increasing demands on the accuracy of the mask characterization, the realization of a correct vector effect calculation for emulating polarization-dependent effects during the mask characterization therefore represents a significant challenge.

Additional background information can be found in, for example, DE 10 2007 045 891 A1, DE 10 2017 115 262 A1, DE 10 2004 033 603 A1, DE 10 2004 033 602 A1, DE 10 2005 062 237 A1, DE 10 2007 009 661 A1 and EP 1 615 062 B1.

SUMMARY

In a general aspect, the present invention provides an apparatus and a method for characterizing a microlithographic mask which enable a more accurate characterization taking account of the conditions given in the lithography process, including the polarization-dependent effects that occur there, whilst at least partly avoiding the above-described problems.

Implementations of the method and the apparatus, respectively, can include the features of the alternative independent claims.

The invention in particular relates to a method for characterizing a microlithographic mask, wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;

wherein a plurality of individual imaging processes are carried out with a pixel resolution specified by the detector unit, wherein these individual imaging processes differ from one another in respect of the position of at least one polarization-optical element situated in the imaging optical unit;

wherein image data recorded by the detector unit are evaluated in an evaluation unit, wherein polarization-dependent effects on account of a polarization dependence of the interference of electromagnetic radiation that takes place in the wafer plane during the operation of the microlithographic projection exposure apparatus are emulated during this evaluation;

wherein this evaluation includes a conversion of the image data obtained in the individual imaging processes, in each case on the basis of at least one calibration image obtained by imaging a structure-free region of the mask onto the detector unit;

wherein the calibration image respectively used during this conversion is chosen differently depending on the position of the at least one polarization-optical element during the relevant individual imaging process.

According to one embodiment, a calibration image that was obtained for the respectively same position of the at least one polarization-optical element in the imaging optical unit is used in each case during the conversion of the image data obtained in the individual imaging processes.

In particular, the invention is based on the concept of carrying out a conversion of the obtained image data on the basis of calibration images obtained by imaging a structure-free region of the mask when characterizing the mask by way of performing a plurality of individual imaging processes, in each case with a different position of one or more polarization-optical elements in the imaging optical unit for the purposes of emulating polarization-dependent effects, said conversion being carried out in such a way that not only are inhomogeneities of the detector unit, the illumination intensity and the transmission properties of the optical system taken into account but also unwanted effects of the polarization-optical elements (in particular in respect of present contaminations and inhomogeneities of the polarization-optical elements) are "removed by calculation" from the measurement results at the same time.

In particular, the invention comprises the principle of not converting all measurement images with one and the same calibration image when converting the image data obtained during the individual imaging processes for the purposes of removing the aforementioned effects by calculation, but rather of recording a respective dedicated calibration image for each position of the polarization-optical elements in the imaging optical unit in order then to combine the measurement images recorded at the different positions of the polarization-optical elements in the imaging optical unit by calculation with the "fitting" calibration image in each case.

Here, according to the invention, increased measurement complexity for recording a plurality of calibration images for the different positions of the polarization-optical element or polarization-optical elements in the imaging optical unit is deliberately accepted in order, in return, to obtain an increased accuracy of the emulation of polarization-dependent effects during the mask characterization whilst at least partly avoiding the problems described at the outset. In particular, the additional measurement complexity during operation according to the invention avoids contaminations and inhomogeneities present on the polarization-optical elements leading to an incorrect vector effect calculation and hence, ultimately, to an erroneous mask characterization.

According to one embodiment, before this conversion at least some of these calibration images are subjected to pre-processing, the brightness of the calibration images being matched to one another in the process.

This pre-processing takes account of the fact that the different brightness levels of the calibration images recorded according to the invention for different positions of the polarization-optical elements, which always exist in the case of polarized illumination, would ultimately lead during combination by calculation with the respectively associated measurement images to the required information about the different degree of brightness of the images being lost (since the "corrected" measurement images ultimately resulting from said conversion would all have the same intensity in that case).

According to one embodiment, the above-described pre-processing (i.e. matching the brightness levels of the calibration images) is omitted if an illumination setting set in the illumination optical unit is an unpolarized illumination setting. This takes account of the fact that, in the case where unpolarized illumination is deliberately set, a "removal by calculation" of a small residual polarization still present is by all means desirable and, in turn, is obtainable by virtue of the above-described pre-processing step being omitted.

According to one embodiment, for the case where the mean intensity drops below a specified threshold in a calibration image obtained for a given position of the at least one polarization-optical element, the conversion of the image data obtained in the individual imaging process carried out in this position of the at least one polarization-optical element is instead implemented on the basis of a calibration image which was recorded without the presence of the polarization-optical elements in the imaging optical unit. This takes account of the fact that the conversion according to the invention on the basis of said particularly dark calibration image would lead to a significant background noise in the ultimately obtained image data, with the consequence that no meaningful image information is obtained any more.

According to one embodiment, the image data recorded by the detector unit during the individual imaging processes are subjected to low-pass filtering prior to the evaluation. Here, the invention proceeds from the idea that the spatial resolution of the detector unit is generally always substantially higher than the spatial resolution of the imaging optical unit, and so the comparatively high spatial frequencies in the image data recorded by the detector unit generally are noise components. Proceeding from this idea, the invention now contains the further concept of already applying a low-pass filter to the image data obtained during the individual imaging processes in each case, which application is necessary in this respect, such that the image data from which said noise component has been removed form the basis of the actual vector effect calculation from the outset. In this context, reference is made to DE 10 2015 213 163 A1.

The above-described application of a low-pass filter already in each case to the image data obtained during the individual imaging processes is also advantageous independently of the above-discussed use of different calibration images. According to a further aspect, the invention consequently also relates to a method for characterizing a microlithographic mask, wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;

wherein a plurality of individual imaging processes are carried out with a pixel resolution specified by the detector unit, wherein these individual imaging processes differ from one another in respect of the position of at least one polarization-optical element situated in the imaging optical unit;

wherein image data recorded by the detector unit are evaluated in an evaluation unit, wherein polarization-dependent effects on account of a polarization dependence of the interference of electromagnetic radiation that takes place in the wafer plane during the operation of the microlithographic projection exposure apparatus are emulated during this evaluation; and wherein the image data recorded by the detector unit during the individual imaging processes are subjected to low-pass filtering prior to the evaluation.

According to one embodiment, during the evaluation of the image data recorded by the detector unit, a change in the imaging scale of the imaging optical unit depending on the position of the polarization-optical elements during the relevant individual imaging process and an image offset depending on the position of the polarization-optical element or the polarization-optical elements during the relevant individual imaging process are at least partly corrected.

According to one embodiment, this correction is implemented by virtue of a stretching centre of centric stretching exerted on an image recorded by the detector unit being displaced relative to the centre of a camera field of the detector unit by a value that depends on the position of the at least one polarization-optical element.

According to one embodiment, for each pixel of the detector unit a focus stack is recorded in the form of a plurality of individual image representations that differ from one another in respect of the respective distance between mask and imaging optical unit, wherein a correction of the relative focal position is carried out pixel-by-pixel by individually fitting the image data respectively obtained per pixel when recording a focus stack. This allows a focus stack to be obtained as a result, said focus stack having a focusing accuracy which may be more accurate than the mechanical reproducibility of the focus adjustment mechanism. Here, the number of focal planes of the interpolated focus stack can be greater than or less than the number of measured focal planes. It is likewise possible for the focus increment between the focal planes of the interpolated focus stack to be greater than or less than the focus increment between the measured focal planes. The focus increment between the focal planes of the measured and/or interpolated focus stack may also be non-equidistant. The result can be a focus stack or else only a single image, e.g., in the ideal best focal plane. To obtain an even more accurate focusing accuracy it is possible to apply the interpolation for the focus correction multiple times (e.g., two times) in succession.

The above-described pixel-by-pixel correction of the relative focal position by individually fitting the image data respectively obtained per pixel when recording a focus stack is also advantageous independently of the above-discussed use of different calibration images. According to a further aspect, the invention consequently also relates to a method for characterizing a microlithographic mask wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;

wherein image data recorded by the detector unit are evaluated in an evaluation unit; and wherein for each pixel of the detector unit a focus stack is recorded in the form of a plurality of individual image representations that differ from one another in respect of the respective distance between mask and imaging optical unit, wherein a correction of the relative focal position is carried out pixel-by-pixel by individually fitting the image data respectively obtained per pixel when recording a focus stack.

According to one embodiment, the mask is designed for a working wavelength of less than 250 nm, in particular for a working wavelength of less than 200 nm, more particularly for a working wavelength of less than 15 nm.

The invention also relates furthermore to an apparatus for characterizing a microlithographic mask, comprising an illumination optical unit for illuminating structures of a mask intended for use in a lithography process in a microlithographic projection exposure apparatus, a detector unit, an imaging optical unit for imaging the mask onto the detector unit and an evaluation unit for evaluating the data recorded by the detector unit, wherein the apparatus is designed to carry out a method having the above-described features.

With regard to further advantages and preferred configurations of the method, reference is made to the above explanations in association with the apparatus according to the invention.

Further configurations of the invention can be gathered from the description and the dependent claims.

The invention is explained in greater detail below on the basis of exemplary embodiments illustrated in the accompanying figures.

BRIEF DESCRIPTION OF DRAWINGS

In the figures:

FIGS. 1A-1C, 2A-2C, and 3A-3C show diagrams for elucidating the effect of a method according to the invention;

FIG. 4 shows a schematic illustration for elucidating one exemplary construction of a mask inspection apparatus; and FIG. 5 shows a diagram for elucidating a focus correction implemented according to one aspect of the present invention.

DETAILED DESCRIPTION

Figure 1A:
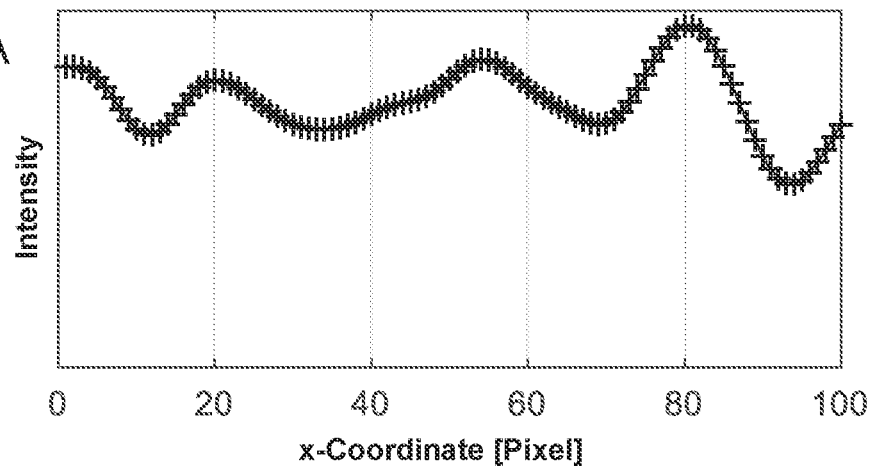

FIG. 4 initially shows a schematic illustration for explaining the possible construction of a mask inspection apparatus 400, in which the present invention can be realized.

As per FIG. 4, in a mask inspection apparatus 400, a mask 421 is mounted on a mask holder 420. The structures to be measured on the mask 421 are illuminated via an illumination optical unit 410 with illumination light generated by a light source 401. Light coming from the mask 421 is imaged by an imaging optical unit 430 onto a detector unit 440 and detected. The image data recorded by the detector unit 440 are evaluated in an evaluation unit 450 for determining the position of the structures.

By way of a pupil filter present in a pupil plane PP in the illumination optical unit 410, and by way of a polarizer 415, in the illumination optical unit 410 it is possible to set an illumination setting which, both in terms of the intensity distribution and in terms of the polarization distribution, corresponds to the illumination setting predefined in the microlithographic projection exposure apparatus. In this case, the polarized illumination setting predefined for the lithography process can be, merely by way of example, a quasi-tangential illumination setting or a quadrupole setting with x-y-polarization.

In order to now also ascertain the vector effects occurring in the microlithographic projection exposure apparatus for the purposes of the best possible emulation of the conditions present during the actual microlithography process, there is—in a manner known in principle per se—the introduction of at least one polarization-optical element into the imaging beam path of the imaging optical unit 430, wherein a plurality of individual imaging processes are carried out for different positions of this at least one polarization-optical element 435.

The image data obtained during the individual imaging processes are converted on the basis of calibration images which are each obtained by imaging a structure-free region of the mask 421 onto the detector unit 440. Using the appropriately converted image data, the aforementioned vector effect calculation is carried out in the manner known per se to a person skilled in the art. To this end, reference is only made by way of example to EP 1 615 062 B1, the entire contents of which are incorporated herein by reference.

According to the invention, it is not only a single calibration image that is recorded for the aforementioned conversion of the image data obtained during the individual imaging processes and that forms the basis of said conversion, but instead a plurality of calibration images are recorded, and form the basis of said conversion, in accordance with the different positions of the polarization-optical element or the polarization-optical elements in the imaging optical unit 430. As a consequence, it is not only inhomogeneities of the detector unit, the illumination intensity and the transmission properties of the optical system that are taken into account during the calibration, but unavoidable contaminations and inhomogeneities of the polarization-optical element or of the polarization-optical elements are also removed from the measurement results by calculation.

The advantageous effect of the method according to the invention is explained below with reference to the diagrams illustrated in FIGS. 1A-1C, FIGS. 2A-2C and FIGS. 3A-3C. For simplicity, these diagrams each represent intensity curves (of measurement or calibration images, as described below) only along the x-coordinate, with the illustration of the intensity curve along the y-coordinate being omitted so as to make the explanations simpler. Moreover, to simplify the explanations relating to the effect obtained according to the invention, reference is made in each case to a measurement image that was recorded when imaging a region of the mask 421 in which the mask 421 does not have a mask structure.

Figure 1B:
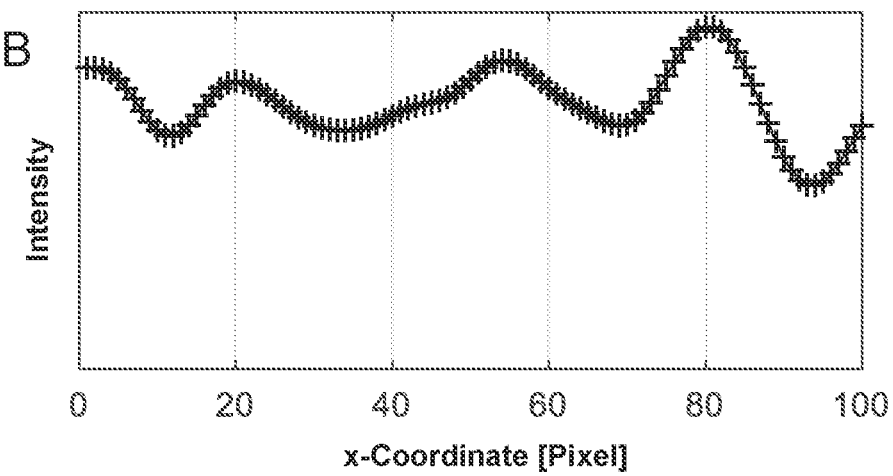
Figure 1C:
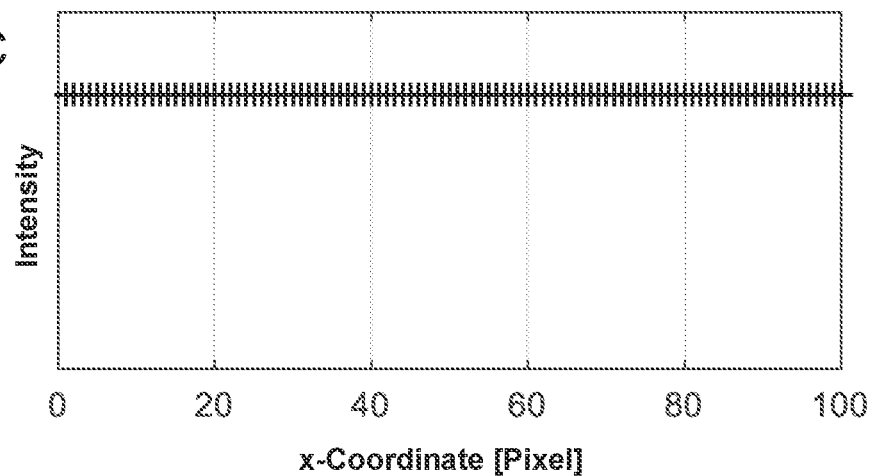

FIG. 1A initially shows the intensity curve along the x-coordinate for such a measurement image and without the presence of a polarization-optical element in the imaging optical unit 430. The inhomogeneity in the intensity profile is illustrated in exaggerated fashion. FIG. 1B shows the intensity curve along the x-coordinate which is obtained in the corresponding calibration image when there are no polarization-optical elements in the imaging optical unit 430. Since the calibration image emerges from the image representation of a structure-free region of the mask 421 by definition, the intensity curve according to FIG. 1B corresponds to that of FIG. 1A. The ratio of the intensities of measurement image and calibration image, plotted in FIG. 1C, thus has a constant value of one along the x-coordinate.

Figure 2A:
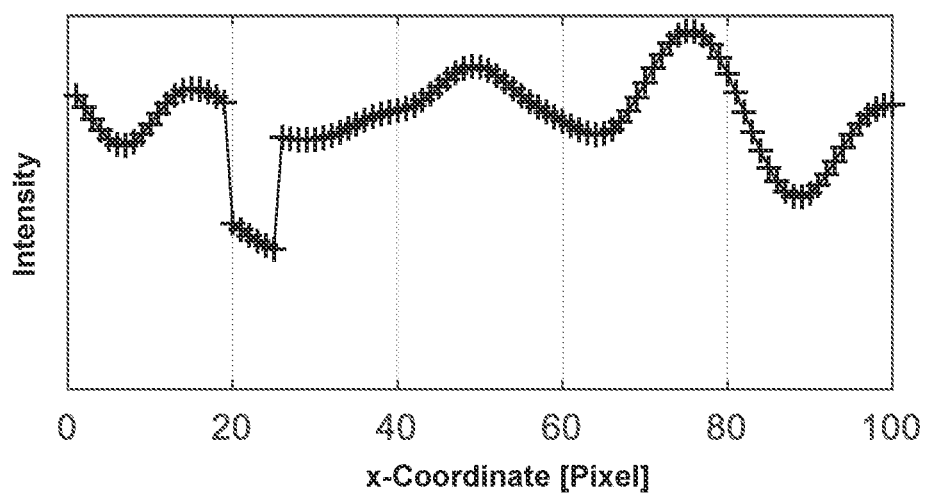
Figure 2B:
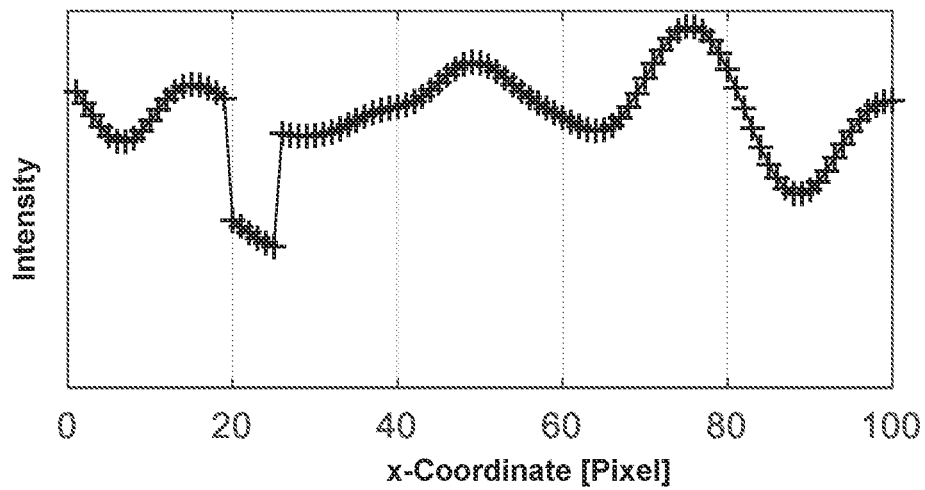
Figure 2C:
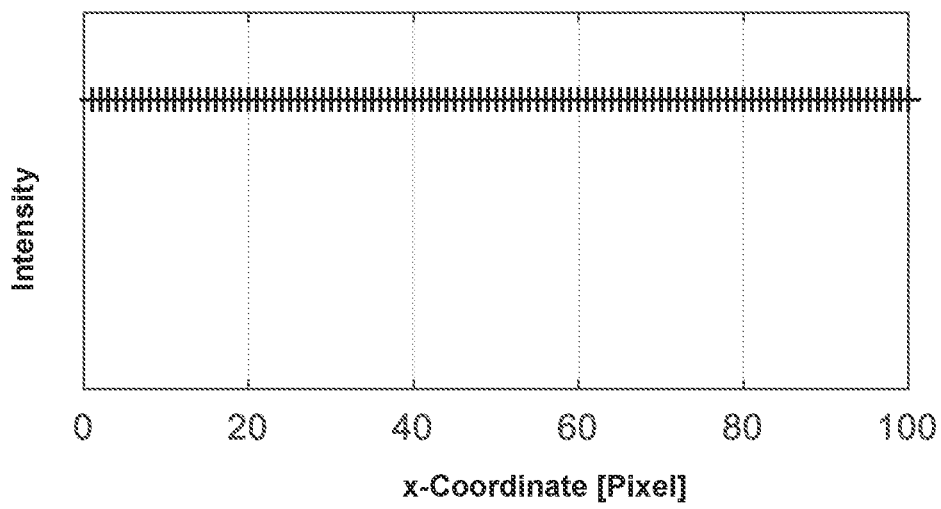

In a manner analogous to FIG. 1A, the diagram of FIG. 2A shows the intensity curve along the x-coordinate obtained in the measurement image (once again at a position where the mask 421 has no structure) if the polarization-optical elements are situated within the imaging optical unit 430 in a certain position. The presence of the polarization-optical element or elements firstly causes an image shift and, furthermore, also a local drop in intensity caused by contaminations and/or inhomogeneities, with the consequence that the intensity curve as per FIG. 2A has been significantly modified relative to that of FIG. 1A. Since, according to the invention, a calibration image is now used for the conversion of the image data obtained during the relevant individual imaging process, which calibration image was obtained for the same position of the polarization-optical elements in the imaging optical unit 430 and consequently has the intensity profile along the x-coordinate illustrated in FIG. 2B, the ratio of the intensity values for measurement image and calibration image, plotted along the x-coordinate as per FIG. 2C, once again supplies the correctly expected constant result for the considered "simple" case of imaging a structure-free region of the mask 421.

By contrast, if only one and the same calibration image were to be used in conventional fashion for converting all measurement images, the scenario illustrated in FIGS. 3A-3C would arise. In this case, the intensity curve of the measurement image illustrated in FIG. 3A (which is identical to the intensity curve of FIG. 2A) would be combined by calculation with the calibration image that was ascertained without the presence of the polarization-optical elements in the imaging optical unit 430, i.e. with the intensity curve illustrated in FIG. 3B, which is identical to that in FIG. 1B. The ratio of the two intensity profiles of FIG. 3A and FIG. 3B, plotted in FIG. 3C, consequently deviates from the correctly expected constant value along the x-coordinate since the image shift caused by the polarization-optical element or the polarization-optical elements and the effect of the contaminations and inhomogeneities present on said polarization-optical elements were not taken into account during the calibration. As a result, this would lead to an erroneous vector effect calculation, which is precisely avoided according to the invention.

A further aspect of the present invention is explained below with reference to FIG. 5.

Here, the invention proceeds from the approach, known per se, of recording for each pixel of the detector unit a focus stack in the form of a plurality of individual image representations that differ from one another in respect of the respective distance between mask and imaging optical unit, in order to characterize the mask not only at the optimal focus but also "when defocussed" and thus to ascertain admissible process windows (in respect of dose and focus). According to the invention, it is now possible to correct the relative focal position pixel-by-pixel by individually fitting the image data respectively obtained per pixel when recording a focus stack. In this way, a focus stack can be obtained as a result, said focus stack having a focusing accuracy which can be more accurate than the mechanical reproducibility of the focus adjustment mechanism.

According to the diagram of FIG. 5, what is now shown when ascertaining the contrast over the set focal planes is that the actual optimal relative focal position for obtaining the maximum contrast ("=Best focus position") slightly deviates from the position which forms the basis when recording a focus stack. According to the invention, this deviation is now taken into account by calculating images for the correspondingly displaced positions from the measurement images (e.g., by a spline interpolation of the intensity of the focal position for each camera pixel on its own) and outputting said images as a result.

Here, the number of focal planes of the interpolated focus stack can be greater than or less than the number of measured focal planes (wherein FIG. 5 also illustrates, merely by way of example, an increase in the number of focal planes from five to seven while reducing the focus increment). Likewise, the focus increment between the focal planes of the interpolated focus stack can be greater than or else less than the focus increment between the measured focal planes. The focus increment between the focal planes of the measured and/or interpolated focus stack can also be non-equidistant. According to FIG. 5, the result can be a focus stack or else only a single image, e.g., in the ideal best focal plane. To obtain an even more accurate focusing accuracy it is possible to apply the interpolation for the focus correction multiple times (e.g., two times) in succession.

In some implementations, the evaluation unit for determining the position of the structures or evaluating image data recorded by the detector unit according to the principles described above can include one or more data processors for processing data, one or more storage devices for storing data, such as one or more databases, and/or one or more computer programs including instructions that when executed by the evaluation unit or a computer causes the evaluation unit or the computer to carry out the processes. The evaluation unit can include one or more input devices, such as a keyboard, a mouse, a touchpad, and/or a voice command input module, and one or more output devices, such as a display, and/or an audio speaker.

In some implementations, the evaluation unit or the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the evaluation unit or the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for characterizing a microlithographic mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable sub combination. The separation of various system components in the embodiments described above should not be understood as requiring such separation in all embodiments.

Even though the invention has been described on the basis of specific embodiments, numerous variations and alternative embodiments will be apparent to a person skilled in the art, for example through combination and/or exchange of features of individual embodiments. Accordingly, it goes without saying for a person skilled in the art that such variations and alternative embodiments are concomitantly encompassed by the present invention, and the scope of the invention is restricted only within the meaning of the appended claims and the equivalents thereof.

What is claimed is:

1. A method for characterizing a microlithographic mask,
wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;
wherein a plurality of individual imaging processes are carried out with a pixel resolution specified by the detector unit, wherein these individual imaging processes differ from one another in respect of the position of at least one polarization-optical element situated in the imaging optical unit;
wherein image data recorded by the detector unit are evaluated in an evaluation unit, wherein polarization-dependent effects on account of a polarization dependence of the interference of electromagnetic radiation that takes place in the wafer plane during the operation of the microlithographic projection exposure apparatus are emulated during this evaluation;
wherein this evaluation includes a conversion of the image data obtained in the individual imaging processes, in each case on the basis of at least one calibration image obtained by imaging a structure-free region of the mask onto the detector unit;
wherein the calibration image respectively used during this conversion is chosen differently depending on the position of the at least one polarization-optical element during the relevant individual imaging process.

2. The method of claim 1, wherein a calibration image that was obtained for the respectively same position of the at least one polarization-optical element in the imaging optical unit is used in each case during this conversion.

3. The method of claim 2, wherein before this conversion at least one of the calibration images is subjected to pre-processing, the brightness of the calibration images being matched to one another in the process.

4. The method of claim 2, wherein for the case where the mean intensity drops below a specified threshold in a calibration image obtained for a given position of the at least one polarization-optical element, the conversion of the image data obtained in the individual imaging process carried out in this position of the at least one polarization-optical element is instead implemented on the basis of a calibration image which was recorded without the presence of the at least one polarization-optical element in the imaging optical unit.

5. The method of claim 2, wherein the image data recorded by the detector unit during the individual imaging processes are subjected to low-pass filtering prior to the evaluation.

6. The method of claim 1, wherein before this conversion at least one of the calibration images is subjected to pre-processing, the brightness of the calibration images being matched to one another in the process.

7. The method of claim 6, wherein this pre-processing is omitted if an illumination setting set in the illumination optical unit is an unpolarized illumination setting.

8. The method of claim 1, wherein for the case where the mean intensity drops below a specified threshold in a calibration image obtained for a given position of the at least one polarization-optical element, the conversion of the image data obtained in the individual imaging process carried out in this position of the at least one polarization-optical element is instead implemented on the basis of a calibration image which was recorded without the presence of the at least one polarization-optical element in the imaging optical unit.

9. The method of claim 1, wherein the image data recorded by the detector unit during the individual imaging processes are subjected to low-pass filtering prior to the evaluation.

10. An apparatus for characterizing a microlithographic mask, comprising
an illumination optical unit for illuminating structures of a mask intended for use in a lithography process in a microlithographic projection exposure apparatus;
a detector unit;
an imaging optical unit for imaging the mask onto the detector unit; and
an evaluation unit for evaluating the data recorded by the detector unit;
wherein the apparatus is designed to carry out a method according to claim 1.

11. The apparatus of claim 10, wherein the mask is designed for a working wavelength of less than 250 nm.

12. The method of claim 1, wherein during the evaluation of the image data recorded by the detector unit, a change in the imaging scale of the imaging optical unit depending on the position of the at least one polarization-optical element during the relevant individual imaging process and an image offset depending on the position of the at least one polarization-optical element during the relevant individual imaging process are at least partly corrected.

13. The method of claim 1, wherein for each pixel of the detector unit a focus stack is recorded in the form of a plurality of individual image representations that differ from one another in respect of the respective distance between mask and imaging optical unit, wherein a correction of the relative focal position is carried out pixel-by-pixel by individually fitting the image data respectively obtained per pixel when recording a focus stack.

14. The method of claim 1, wherein the mask is designed for a working wavelength of less than 250 nm.

15. A method for characterizing a microlithographic mask,
wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;
wherein a plurality of individual imaging processes are carried out with a pixel resolution specified by the detector unit, wherein these individual imaging processes differ from one another in respect of the position of at least one polarization-optical element situated in the imaging optical unit;
wherein image data recorded by the detector unit are evaluated in an evaluation unit, wherein polarization-dependent effects on account of a polarization dependence of the interference of electromagnetic radiation that takes place in the wafer plane during the operation of the microlithographic projection exposure apparatus are emulated during this evaluation;

wherein the image data recorded by the detector unit during the individual imaging processes are subjected to low-pass filtering prior to the evaluation, wherein during the evaluation of the image data recorded by the detector unit, a change in the imaging scale of the imaging optical unit depending on the position of the at least one polarization-optical element during the relevant individual imaging process and an image offset depending on the position of the at least one polarization-optical element during the relevant individual imaging process are at least partly corrected, and wherein this correction is implemented by virtue of a stretching center of centric stretching exerted on an image recorded by the detector unit being displaced relative to the center of a camera field of the detector unit by a value that depends on the position of the at least one polarization-optical element.

16. The method of claim 15, wherein for each pixel of the detector unit a focus stack is recorded in the form of a plurality of individual image representations that differ from one another in respect of the respective distance between mask and imaging optical unit, wherein a correction of the relative focal position is carried out pixel-by-pixel by individually fitting the image data respectively obtained per pixel when recording a focus stack.

17. The method of claim 15, wherein for a first one of the plurality of individual imaging processes, the at least one polarization-optical element is situated at a first position in the imaging optical unit, and for a second one of the plurality of individual imaging processes, the at least one polarization-optical element is situated at a second position in the imaging optical unit, the second position is different from the first position;

wherein first image data recorded by the detector unit when the at least one polarization-optical element is situated at the first position are evaluated in a way such that polarization-dependent effects on account of the polarization dependence of the interference of electromagnetic radiation that takes place in the wafer plane during the operation of the microlithographic projection exposure apparatus are emulated taking into account of the at least one polarization-optical element being situated at the first position, and wherein second image data recorded by the detector unit when the at least one polarization-optical element is situated at the second position are evaluated in a way such that polarization-dependent effects on account of the polarization dependence of the interference of electromagnetic radiation that takes place in the wafer plane during the operation of the microlithographic projection exposure apparatus are emulated taking into account of the at least one polarization-optical element being situated at the second position.

18. A method for characterizing a microlithographic mask, wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;

wherein image data recorded by the detector unit are evaluated in an evaluation unit; and wherein for each pixel of the detector unit a focus stack is recorded in the form of a plurality of individual image representations that differ from one another in respect of the respective distance between mask and imaging optical unit, wherein a correction of the relative focal position is carried out pixel-by-pixel by individually fitting the image data respectively obtained per pixel when recording a focus stack.

19. The method of claim 18, wherein the mask is designed for a working wavelength of less than 250 nm.

20. A method for characterizing a microlithographic mask, wherein structures of a mask intended for use in a lithography process in a microlithographic projection exposure apparatus are illuminated by an illumination optical unit and wherein the mask is imaged onto a detector unit by an imaging optical unit, wherein the detector unit has a plurality of pixels;

wherein a plurality of individual imaging processes are carried out with a pixel resolution specified by the detector unit, wherein these individual imaging processes differ from one another in respect of the position of at least one polarization-optical element situated in the imaging optical unit;

wherein for a first one of the plurality of individual imaging processes, the at least one polarization-optical element is situated at a first position in the imaging optical unit, and for a second one of the plurality of individual imaging processes, the at least one polarization-optical element is situated at a second position in the imaging optical unit, the second position is different from the first position;

wherein image data recorded by the detector unit are evaluated in an evaluation unit, wherein polarization-dependent effects on account of a polarization dependence of the interference of electromagnetic radiation that takes place in the wafer plane during the operation of the microlithographic projection exposure apparatus are emulated during this evaluation;

wherein first image data recorded by the detector unit when the at least one polarization-optical element is situated at the first position are evaluated in a way such that polarization-dependent effects on account of the polarization dependence of the interference of electromagnetic radiation that takes place in the wafer plane during the operation of the microlithographic projection exposure apparatus are emulated taking into account of the at least one polarization-optical element being situated at the first position, wherein second image data recorded by the detector unit when the at least one polarization-optical element is situated at the second position are evaluated in a way such that polarization-dependent effects on account of the polarization dependence of the interference of electromagnetic radiation that takes place in the wafer plane during the operation of the microlithographic projection exposure apparatus are emulated taking into account of the at least one polarization-optical element being situated at the second position, wherein the image data recorded by the detector unit during the individual imaging processes are subjected to low-pass filtering prior to the evaluation, and wherein for each pixel of the detector unit a focus stack is recorded in the form of a plurality of individual image representations that differ from one another in respect of the respective distance between mask and imaging optical unit, wherein a correction of the relative focal position is carried out pixel-by-pixel by individually fitting the image data respectively obtained per pixel when recording a focus stack.

\* \* \* \* \*

UNITED STATES PATENT AND TRADEMARK OFFICE
CERTIFICATE OF CORRECTION

PATENT NO. : 11,619,882 B2
APPLICATION NO. : 17/470340
DATED : April 4, 2023
INVENTOR(S) : Ulrich Matejka et al.

It is certified that error appears in the above-identified patent and that said Letters Patent is hereby corrected as shown below:

In the Drawings

Sheet 5 of 5 (Fig. 5), in the text on left side of the diagram, Line 1, delete "sured" and insert -- Measured --

Sheet 5 of 5 (Fig. 5), Line 2, delete "ntly" and insert -- (slightly --

Sheet 5 of 5 (Fig. 5), Line 3, before "focus" insert -- best --

Sheet 5 of 5 (Fig. 5), Line 4, delete "rpolated" and insert -- Interpolated --

Sheet 5 of 5 (Fig. 5), Line 5, delete "fectly" and insert -- (perfectly --

Sheet 5 of 5 (Fig. 5), Line 6, delete "'polated" and insert -- Interpolated --

Sheet 5 of 5 (Fig. 5), Line 7, delete "ectly" and insert -- perfectly --

Sheet 5 of 5 (Fig. 5), Line 8, delete "s" and insert -- focus --

Signed and Sealed this
Twenty-fourth Day of October, 2023

Katherine Kelly Vidal
*Director of the United States Patent and Trademark Office*